(12) United States Patent
Asikainen et al.

(10) Patent No.: US 7,236,762 B2
(45) Date of Patent: Jun. 26, 2007

(54) DIRECT-CONVERSION RECEIVER SYSTEM AND METHOD, ESPECIALLY A GPS RECEIVER SYSTEM WITH HIGH PASS FILTERING

(75) Inventors: Kalle Asikainen, Pirkkala (FI); Tomi-Pekka Takalo, Pirkkala (FI)

(73) Assignee: Nokia Corporation, Espoo (FI)

( * ) Notice: Subject to any disclaimer, the term of this patent is extended or adjusted under 35 U.S.C. 154(b) by 786 days.

(21) Appl. No.: 10/023,559

(22) Filed: Dec. 18, 2001

(65) Prior Publication Data
US 2002/0081990 A1    Jun. 27, 2002

(30) Foreign Application Priority Data
Dec. 22, 2000   (FI)   ................................. 20002832

(51) Int. Cl.
*H04B 1/26* (2006.01)
(52) U.S. Cl. ..................................... 455/323
(58) Field of Classification Search ............... 455/130, 455/147, 182.1, 196.1, 204, 264, 265, 311, 455/313, 131, 203, 208, 77, 227, 303, 323, 455/324
See application file for complete search history.

(56) References Cited

U.S. PATENT DOCUMENTS

| | | | | |
|---|---|---|---|---|
| 4,653,117 A | * | 3/1987 | Heck | 455/209 |
| 4,672,636 A | | 6/1987 | Marshall et al. | 375/88 |
| 4,944,025 A | * | 7/1990 | Gehring et al. | 455/207 |
| 5,079,526 A | * | 1/1992 | Heck | 332/127 |
| 5,850,598 A | | 12/1998 | Behrent | 455/324 |
| 5,901,344 A | * | 5/1999 | Opas | 455/76 |
| 6,029,058 A | | 2/2000 | Namgoong et al. | 455/324 |
| 6,160,858 A | | 12/2000 | Hindman et al. | 375/336 |
| 6,510,313 B1 | * | 1/2003 | Rapeli | 455/323 |

FOREIGN PATENT DOCUMENTS

| GB | 2347284 A | 8/2000 |
|---|---|---|
| WO | WO 99/57912 | 11/1999 |

* cited by examiner

*Primary Examiner*—Curtis Kuntz
*Assistant Examiner*—Alexander Jamal
(74) *Attorney, Agent, or Firm*—Perman & Green, LLP

(57) ABSTRACT

The invention relates to a direct conversion receiver and a method in a direct conversion receiver for processing received radio signals that are modulated and centered at a carrier frequency, the modulation extending a sideband above and below the carrier frequency. The method comprises the steps of mixing a local oscillator frequency signal with said received radio signals for generating baseband frequency signals; filtering out generated disturbing direct current (DC) components of said baseband signals centered at the zero frequency; setting said local oscillator frequency signal equal to or about the carrier frequency plus an offset frequency, said offset frequency being equal to the difference between the carrier frequency and a null frequency, said null frequency centered at a notch of said sideband; and centering said notch at the zero frequency of said baseband signals through mixing. The invention relates particularly to suppression of DC offsets generated in the receivers.

21 Claims, 2 Drawing Sheets

DIRECT-CONVERSION RECEIVER SYSTEM AND METHOD, ESPECIALLY A GPS RECEIVER SYSTEM WITH HIGH PASS FILTERING

BACKGROUND OF THE INVENTION

The invention relates generally to direct-conversion radio receivers and to methods in direct conversion, especially for phase modulated carrier signals transmitting digital information. The invention also relates to suppression of direct current (DC) offsets generated in receivers.

In digital modulation, the modulating signal is digital, containing a bit stream of "1s" and "0s", and mixed in a modulator with a carrier signal for transmission. The basic modulation schemes are amplitude-shift keying (ASK), frequency-shift keying (FSK) and phase-shift keying (PSK). In PSK, the signals representing the states "1" and "0" have a difference in phase. In binary phase-shift keying (BPSK), the phase has two different states. In quadriphase-shift keying (QPSK) modulation, the phase has four different states. In digital modulation changes in the modulated signal waveform spread the power of the signal to a wide frequency range. The spectrum of the signal comprises usually a wide main lobe at a carrier frequency. The main lobe has smaller side lobes around it on a frequency scale. Before modulation, at a direct current (DC) or baseband, the spectrum is just one half of this and the carrier frequency represents a zero frequency (0 Hz). The lobes are separated by notches, i.e. null points situated at multiples of the data rate (including the multiple of 1), i.e. bit rate (bits per second), from the carrier frequency.

Direct-conversion receivers, i.e. zero-IF receivers are known in the art. In a zero-IF receiver (IF, Intermediate frequency) received signals are mixed with an output of a down conversion oscillator to translate the received signal to the baseband. A down conversion oscillator is a local oscillator generating a signal on the carrier frequency. The phase-modulated input signal is split into two branches and the frequency of the local oscillator is mixed with the two branches (the other one with a 90° difference in phase). The output mixed signal in a branch without any phase shift is the in-phase signal (I), and the other one having a 90° difference in phase is the quadrature signal (Q). Lowpass or complex filters are provided to remove undesired sum products caused by mixer nonlinearities from the mixing. I/Q signals are preamplified, if needed, and input to analog to digital converters (ADCs) for signal processing. A demodulated signal is calculated from the I and Q signals using a processor system (DSP, Digital signal processing). The I and Q signals also exhibit DC offsets.

In direct-conversion receivers the pure carrier signal gives rise to a DC signal at the mixer output. Other undesired signals at the mixer input give rise to mixing products, the spectrum of which is located around the DC. Other sources of DC offsets include the synchronization of a local oscillator at a carrier frequency and the DC offsets in amplifiers and other circuit elements of the receiver due to temperature, aging, crosstalk, etc. The high gain of the baseband circuitry of the receiver amplifies DC offsets to the extent that the operating range of the circuitry is exceeded. Often the DC offset is compensated using a DC nulling circuitry that measures the offset before the reception and cancels it by means of a voltage that is charged into a large capacitor. High-level transmitters, interfering the reception of a signal of a lower level transmission signal, and starting or stopping their transmission during reception of a spread spectrum device change the DC offset and thus cause disfunctionality in the receiver. The DC offset compensation should be active during the actual spread-spectrum reception, which, on the other hand, results in a more complicated compensation circuitry.

DC offset voltages have a large dynamic range when compared to a useful signal spectrum, resulting in amplifier saturation or problems with the ADC conversion. One method to block the DC offsets is to AC couple the output of the mixer with a large coupling capacitor for generating a narrow notch at a DC frequency. Large capacitors are used to facilitate the use of very low corner frequencies near the zero frequency. The portion of the modulated signal centered around the carrier frequency is also lost, wherein distortion is caused in the demodulation, since the DC notch frequencies contain information. Large capacitors require high current drive capability consuming a lot of power and using a lot of space on printed circuit boards (PCBs).

SUMMARY OF THE INVENTION

An object of the present invention is to provide a method in a direct-conversion receiver for processing received radio signals that are modulated and centered at a carrier frequency.

Another object of the present invention is to provide a direct-conversion receiver for processing modulated radio signals that are centered at a carrier frequency.

Another object of the present invention is to provide a GPS direct conversion receiver for processing phase-modulated radio signals that are centered at a carrier frequency for receiving digital information.

Another object of the present invention is to provide a method for processing modulated radio signals that are centered at a carrier frequency in a direct conversion receiver.

With the invention, considerable advantages are achieved. A portion of the modulated signal centered around the carrier frequency is preserved and information is not lost. The use of other than large capacitors is facilitated since a notch generated by the AC coupling is situated at notches or null points of the signal spectrum. Consequently, lost modulation energy due AC coupling is considerably lower compared to the case when the AC coupling is at the center of a lobe of the spectrum.

In accordance with the present invention, a local oscillator used exhibits a frequency offset from the carrier frequency of the received signal. In prior art receivers, complicated control circuits were used to tune the frequency of the local oscillator as precisely as possible to the carrier frequency. In the present invention, a direct conversion receiver includes the AC coupling and the offset frequency is such that the frequency spectrum of the modulated signal is moved accordingly to align the DC notch at a spectrum notch, i.e. the frequency of the local oscillator equals with or is about a null point of the modulated signal spectrum, fluctuations and necessary, small differences permitting. Therefore, requirements for the AC coupling are easier to fulfil, the amount of lost energy and information is minimized and distortion of the modulated signal is reduced.

One advantage of the present invention is that high pass filters (for example a first order filter comprising a capacitor in series and corresponding to the AC coupling) in I and Q branches of the receiver are filtering out energy from the offsets which do not contain any significant or any amount of modulation power. The size of the capacitor is determined by a desired frequency crossover point (amount of power reduction vs. null frequency). The higher the value of the capacitor, the lower the high pass frequency will be. Reduction of power increases at frequencies lower than a filter corner frequency which equals to or is slightly higher than the null frequency.

In particular, the present invention is used in spread spectrum systems such as GPS (Global Positioning System) using CDMA techniques. CDMA (Code Division Multiple Access) is a known method of frequency reuse whereby many transmitters use the same frequency but each has a unique code. The transmitted signal is spread over a frequency band much wider than the minimum bandwidth needed to transmit the information being sent. In GPS this is done by modulating with a pseudo random code. In GPS digital communication the transition time for individual bits is called chip rate, which for the GPS carrier is 1.023 MHz.

In the present invention, the local oscillator offset is set to multiples of 1.023 MHz (first null at 1.023 Hz, second null at 2.046, etc.) equalling to the spectral nulls of a biphase-modulated signal.

BRIEF DESCRIPTION OF THE DRAWINGS

In the following, the present invention will be described in more detail with reference to the appended drawings, in which.

DETAILED DESCRIPTION OF EMBODIMENTS

Figure 1:
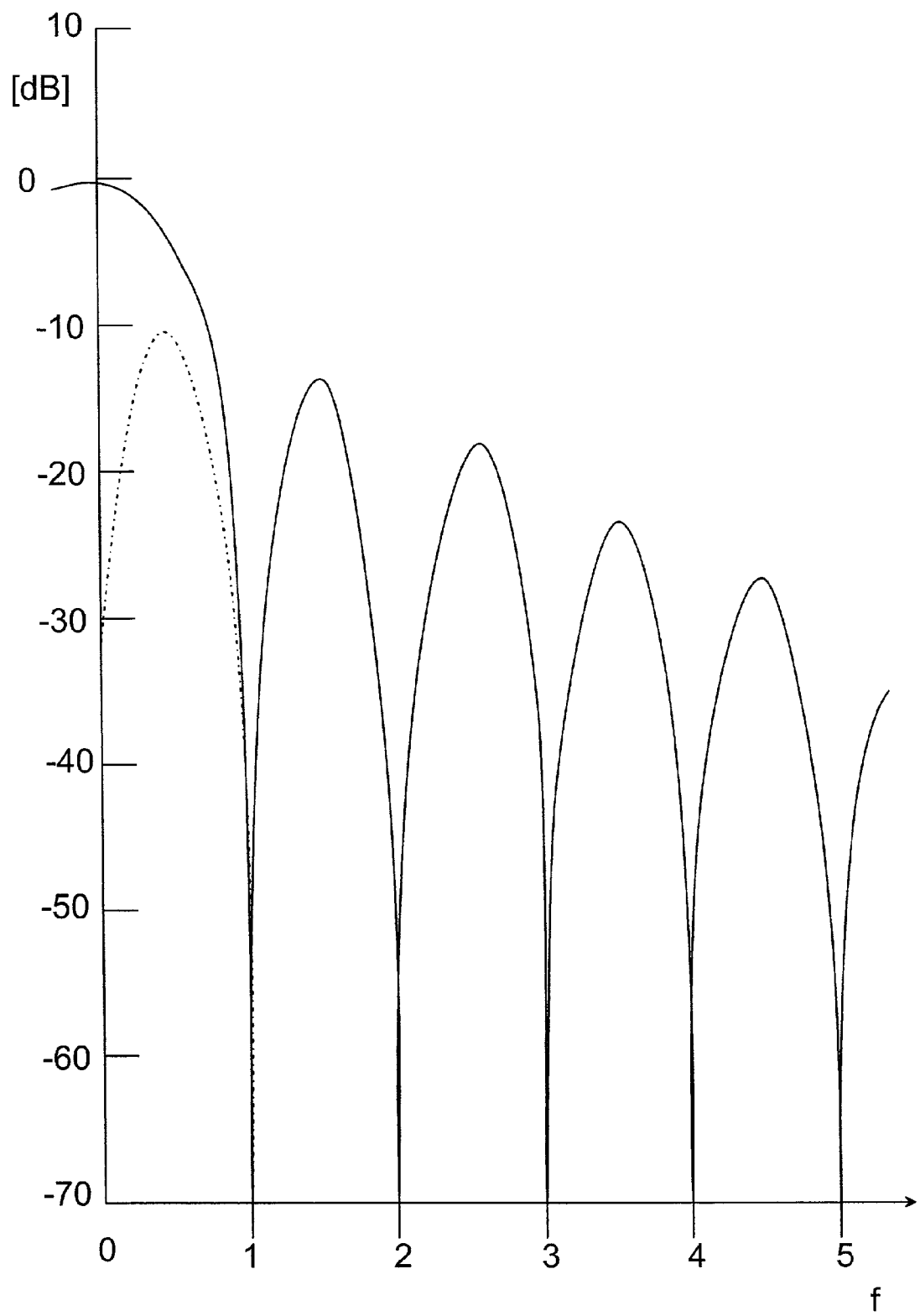
FIG. 1 shows an example of modulated GPS signal spectrum shown on baseband frequency.

FIG. 1 shows the most significant part of a modulated GPS signal spectrum at baseband frequency with a main lobe and side lobes, which all form the applicable sideband on both sides of the carrier frequency. The horizontal frequency scale is normalized to correspond the chip rate (inverse of the bit duration time) in order to show the signal going through null points periodically and the spectral notches (i.e. null points) at the multiples of the chip rate. The difference between the notches and the normalized zero frequency correspond to the frequency offset of the local oscillator (the offset frequency equalling to or being about the local oscillator frequency minus the carrier signal frequency). The DC notch caused by the AC coupling is also shown in broken line. The vertical power density scale in decibel (dB) is normalized to correspond to the main lobe. In the present invention, due to the offset frequency, the signal spectrum is moved right and a notch to the left from the main lobe is aligned with the center frequency. The receiver comprises bandpass or complex filtering in I and Q branches for further suppression of undesired mixing products and adjacent channels. The complex filtering has non-symmetrical response around zero frequency and they effect better noise bandwidth.

Figure 2:
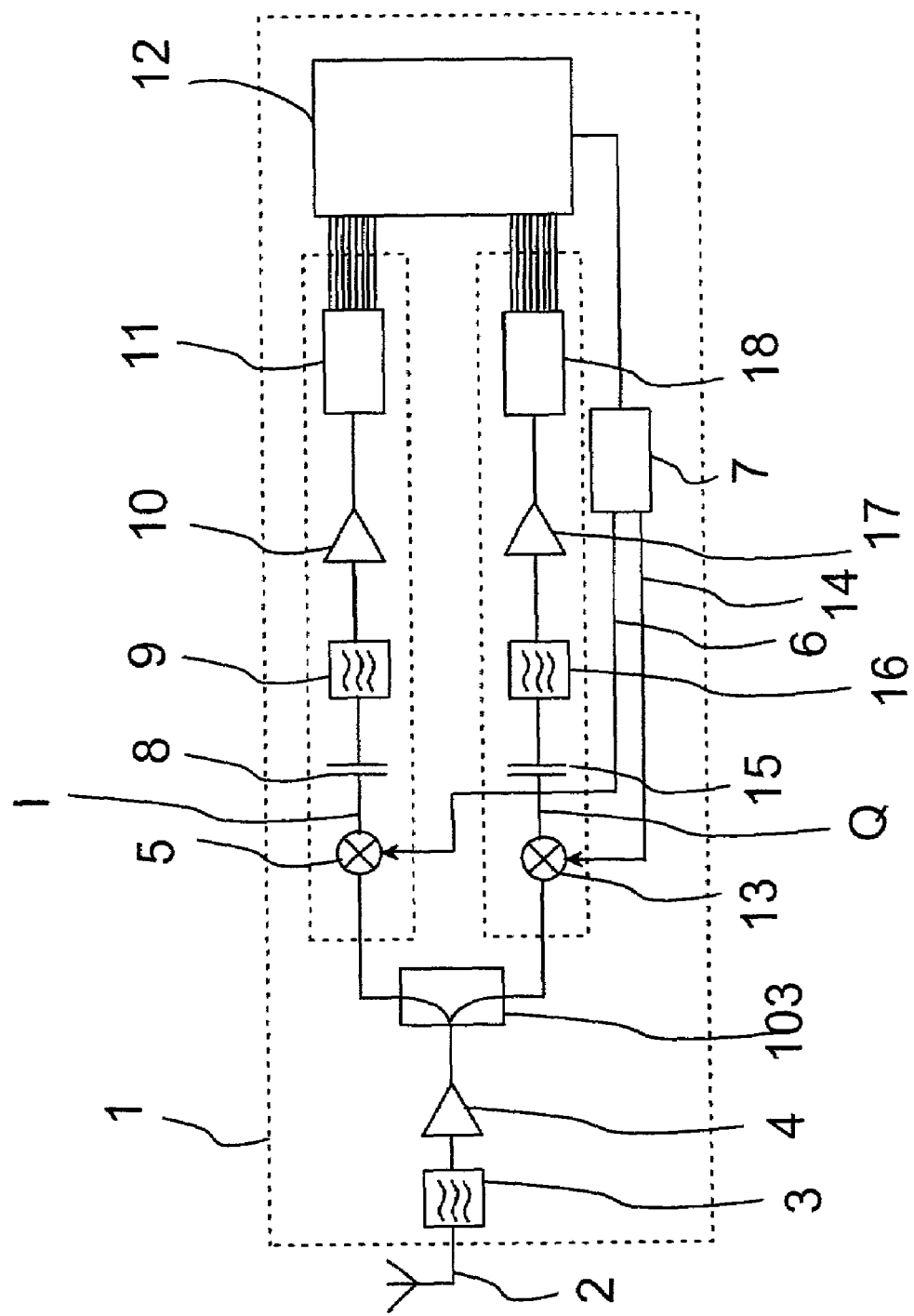
FIG. 2 shows a block diagram of a direct conversion receiver in accordance with the present invention.

FIG. 2 shows the essential parts of the direct conversion receiver (i.e. zero-IF receiver) 1 to the extent necessary for the understanding of the invention. A more detailed selection of components and subsystems based on this description is clear to a person skilled in the art. A means for receiving and splitting radio signals comprise, for example, an antenna 2, filter 3, an amplifier 4, and a divider 103. The incoming radio signal (RF, Radio frequency), which is received using the antenna 2 and usually preamplified in the amplifier 4, is split into a first component and a second component (usually using the signal divider 103). The first component is fed to a first mixer means 5 in which the first signal part is mixed with a signal present at first output 6 of a local oscillator 7. As a result of this, an in-phase signal I is generated at the mixer S output. Undesired mixing products and also DC offsets are separated off in a filtering means formed by an AC coupling 8 and a first filter 9, for example. The filtered signal is fed to a signal amplifier 10 and after that to a first ADC-converter 11. The signal is further fed to a processor system 12, containing other circuit assemblies and blocks, for demodulation and further processing. Usually the oscillator 7 is regulated, for example to select the offset frequency, by the processor system 12.

The second component is fed to a second mixer means 13 in which the second signal part is mixed with a signal present at a second output 14 of the local oscillator 7. The signal at the second output 14 is phase shifted 90° in relation to the signal at the first output 6. As a result of this, the quadrature signal Q is generated at the output of the mixer 13. Undesired mixing products and also DC offsets are separated off in an AC coupling 15 and a second filter 16. The filtered signal is fed to a signal amplifier 17 and after that to a second AD-converter 18. The signal is further fed to a processor system 12.

The direct conversion receiver forms a part of a receiver system dedicated, for example and specifically, to the GPS reception and information processing. Further components of the GPS receiver are chosen according to desired specifications in a way known as such to a person skilled in the art.

The invention is not limited to the above-described examples or to the drawings showing examples of one embodiment, but can be varied within the scope of the appended claims.

The invention claimed is:

1. A method in a direct conversion receiver for processing a received signal, comprising:
    mixing an oscillator frequency signal with said received signal for generating baseband frequency signals, wherein said received signal is modulated and centered at a carrier frequency, said received signal has a spectral characteristic of a plurality of lobes separated by notches, the notches being at null points located on a frequency axis at multiples of a chip rate from the carrier frequency, and the modulation extends a sideband above and below the carrier frequency;
    filtering out generated direct current (DC) components of said baseband signals centered at the zero frequency;
    setting said oscillator frequency signal equal to or about the carrier frequency plus an offset frequency, said offset frequency being equal to or about the difference between the carrier frequency and a null frequency, said null frequency centered at a notch of said sideband; and
    centering said notch at the zero frequency of said baseband signals through mixing.

2. A direct conversion receiver for processing a signal, comprising:
    at least one circuit element for receiving said signal, said signal being centered at a carrier frequency and has modulation extending a sideband above and below said carrier frequency, said signal having a spectral characteristic of a plurality of lobes separated by notches, the notches being at null points located on a frequency axis at multiples of a chip rate from the carrier frequency, the at least one circuit element having a first signal output and a second signal output;

an oscillator for providing a frequency and having a first frequency output and a second frequency output, said second frequency output having a phase shift compared with said first output;

a first mixer coupled to said first signal output and first frequency output for generating a baseband frequency in-phase signal;

a second mixer coupled to said second signal output and second frequency output for generating a baseband frequency quadrature phase signal;

a first filter for the suppression of said in-phase signal centered at the zero frequency; and a second filter for the suppression of said quadrature signal centered at the zero frequency;

wherein the receiver is configured to provide an oscillator frequency that is equal to or about the carrier frequency plus an offset frequency, said offset frequency being equal to or about the difference between the carrier frequency and a null frequency, said null frequency centered at a notch of said sideband, for centering said notch at the zero frequency of said baseband signals through mixing.

3. A direct conversion receiver according to claim 2, further comprising a third filter for the suppression of said in-phase signal being greater than a set corner frequency; and a fourth filter for the suppression of said quadrature signal being greater than a set corner frequency.

4. A direct conversion receiver according to claim 2, wherein said first filter comprises a first AC coupling element for producing a notch at the zero frequency of said in-phase signal; and said second filter comprises a second AC coupling element for producing a notch at the zero frequency of said quadrature signal.

5. A direct conversion receiver according to claim 2, wherein said first filter and said second filter each comprise a high pass filter, the first filter coupled to the output of the first mixer and the second filter coupled to the output of the second mixer.

6. A direct conversion receiver according to claim 2, further comprising a processor for demodulation and processing said in-phase and quadrature signals and for controlling said oscillator frequency.

7. A GPS direct conversion receiver for processing a signal, comprising:
    a device for splitting said signal, said device having a first signal output and a second signal output, wherein said signal is a phase modulated radio signal centered at a carrier frequency for receiving digital information, the phase modulation extending a sideband above and below the carrier frequency, and wherein said signal has a spectral characteristic of a plurality of lobes separated by notches, the notches being at null points located on a frequency axis at multiples of a chip rate from the carrier frequency;
    an oscillator for providing a frequency and having a first frequency output and a second frequency output, said second frequency output having a 90° phase shift compared with said first output;
    a first mixer coupled to said first signal output and first frequency output for generating a baseband frequency in-phase signal;
    a second mixer coupled to said second signal output and second frequency output for generating a baseband frequency quadrature phase signal;
    a first filter for the suppression of said in-phase signal centered at the zero frequency; and
    a second filter for the suppression of said quadrature signal centered at the zero frequency;
    wherein the receiver is configured to provide an oscillator frequency that is equal to or about the carrier frequency plus an offset frequency, said offset frequency being equal to or about a chip rate or a multiple of it for centering said oscillator frequency at a notch of said sideband, and for centering said notch at the zero frequency of said baseband signal through mixing.

8. A GPS direct conversion receiver according to claim 7, wherein said first filter comprises a first high pass filter for producing a notch at the zero frequency of said in-phase signal; and said second filter comprises a second high pass filter for producing a notch at the zero frequency of said quadrature signal.

9. A method in a direct conversion receiver for processing a signal, comprising:
    splitting said signal into a first signal output and a second signal output, said signal being modulated and centered at a carrier frequency, the modulation extending a sideband above and below the carrier frequency, and wherein said signal has a spectral characteristic of a plurality of lobes separated by notches, the notches being at null points located on a frequency axis at multiples of a chip rate from the carrier frequency;
    tuning an oscillator for generating a first frequency output and a second frequency output, said second frequency output having a phase shift compared with said first frequency output;
    mixing said first signal output and first frequency output for generating a baseband frequency in-phase signal;
    mixing said second signal output and second frequency output for generating a baseband frequency quadrature phase signal;
    filtering out an in-phase signal centered at the zero frequency;
    filtering out a quadrature signal centered at the zero frequency;
    setting said oscillator frequency equal to or about the carrier frequency plus an offset frequency, said offset frequency being equal to or about the difference between the carrier frequency and a null frequency, said null frequency being centered at a notch of said sideband; and
    centering said notch at the zero frequency of said baseband signals through mixing.

10. A method according to claim 9, wherein the method further comprises:
    high pass filtering said in-phase signal for producing a notch at the zero frequency of said in-phase signal; and
    high pass filtering said quadrature signal for producing a notch at the zero frequency of said quadrature signal.

11. A method in a direct conversion receiver for processing a received signal, comprising:
    mixing an oscillator frequency signal with said received signal for generating baseband frequency signals, wherein said received signal is modulated and centered at a carrier frequency, wherein a frequency spectrum of the received signal has a main lobe and side lobes with successive ones of the lobes being separated by spectral null points, the spectral null points being located at multiples of a chip rate of the received signal, the modulation extending a sideband above and below the carrier frequency;
    filtering out generated direct current (DC) components of said baseband signals centered at the zero frequency;

setting said oscillator frequency signal equal to or about the carrier frequency plus an offset frequency, said offset frequency being equal to or about the difference between the carrier frequency and a null frequency of said received signal spectrum, said null frequency being centered at a notch of said sideband; and centering said notch at the zero frequency of said baseband signals through mixing.

12. A direct conversion receiver for processing a received signal, the receiver comprising:

a splitter for splitting said signal, said splitter having a first signal output and a second signal output, the received signal being a modulated signal centered at a carrier frequency, the modulation extending a sideband above and below said carrier frequency, wherein a frequency spectrum of the received signal has a main lobe and side lobes with successive ones of the lobes being separated by spectral null points, the spectral null points being located at multiples of a chip rate of the received signal;

an oscillator for providing a frequency and having a first frequency output and a second frequency output, said second frequency output having a phase shift compared with said first frequency output;

a first mixer coupled to said first signal output and first frequency output for generating a baseband frequency in-phase signal;

a second mixer coupled to said second signal output and second frequency output for generating a baseband frequency quadrature phase signal;

a first filter for the suppression of said in-phase signal centered at the zero frequency; and a second filter for the suppression of said quadrature signal centered at the zero frequency;

wherein the receiver is configured for providing an oscillator frequency that is equal to or about the carrier frequency plus an offset frequency, said offset frequency being equal to or about a difference between the carrier frequency and a null frequency of said received signal spectrum, said null frequency being centered at a notch of said sideband, for centering said notch at the zero frequency of said baseband signals through mixing.

13. A receiver for processing a signal, the receiver comprising:

a divider for splitting said signal, said divider having a first signal output and a second signal output, wherein the signal is a modulated signal centered at a carrier frequency, the modulation extending a sideband above and below said carrier frequency, said signal having a spectral characteristic of a plurality of lobes separated by notches, the notches being at null points located on a frequency axis at multiples of a chip rate from the carrier frequency;

an oscillator for providing a frequency and having a first frequency output and a second frequency output, said second frequency output having a phase shift compared with said first output;

a first mixer coupled to said first signal output and said first frequency output for generating a baseband frequency in-phase signal;

a second mixer coupled to said second signal output and second frequency output for generating a baseband frequency quadrature phase signal;

a first filter for the suppression of said in-phase signal centered at the zero frequency;

a second filter for the suppression of said quadrature signal centered at the zero frequency;

wherein the receiver is configured for providing an oscillator frequency that is equal to or about the carrier frequency plus an offset frequency, said offset frequency being equal to or about the difference between the carrier frequency and a null frequency, said null frequency being centered at a notch of said sideband, for centering said notch at the zero frequency of said baseband signals through mixing.

14. A receiver according to claim 13, wherein, for channel selection, said receiver further comprises a third filter for the suppression of said in-phase signal being greater than a set corner frequency; and a fourth filter for the suppression of said quadrature signal being greater than a set corner frequency.

15. A receiver according to claim 13, wherein said first filter comprises a first AC coupling for producing a notch at the zero frequency of said in-phase signal; and said second filter comprises a second AC coupling for producing a notch at the zero frequency of said quadrature signal.

16. A receiver according to claim 13, wherein said first filter and the second filter each comprise a high pass filter, the first filter coupled to the output of the first mixer and the second filter coupled to the output of the second mixer.

17. A receiver according to claim 13, wherein said receiver further comprises a processor for demodulation and processing said in-phase and quadrature signals and for controlling said oscillator frequency.

18. A receiver for processing a received signal, the receiver comprising:

a divider for splitting said received signal, said received signal being a modulated signal that is centered at a carrier frequency, the modulation extending a sideband above and below said carrier frequency, wherein a frequency spectrum of the received signal has a main lobe and side lobes with successive ones of the lobes being separated by spectral null points, the spectral null points being located at multiples of a chip rate of the received signal, said divider having a first signal output and a second signal output;

an oscillator for providing a frequency and having a first frequency output and a second frequency output, said second frequency output having a phase shift compared with said first frequency output;

a first mixer coupled to said first signal output and said first frequency output for generating a baseband frequency in-phase signal;

a second mixer coupled to said second signal output and said second frequency output for generating a baseband frequency quadrature phase signal;

a first filter for the suppression of said in-phase signal centered at the zero frequency; and a second filter for the suppression of said quadrature signal centered at the zero frequency;

wherein the receiver is configured for providing an oscillator frequency that is equal to or about the carrier frequency plus an offset frequency, said offset frequency being equal to or about a difference between the carrier frequency and a null frequency of said received signal spectrum, said null frequency centered at a notch of said sideband, for centering said notch at the zero frequency of said baseband signals through mixing.

19. A direct conversion receiver comprising:

means for mixing an oscillator frequency signal with a received signal that is modulated and centered at a carrier frequency, the modulation extending a sideband above and below the carrier frequency, for generating baseband frequency signals, and wherein said received signal has a spectral characteristic of a plurality of lobes separated by notches, the notches being at null points located on a frequency axis at multiples of a chip rate from the carrier frequency;

means for filtering generated direct current components of the generated baseband frequency signals centered at a zero frequency;

means for adjusting the oscillator frequency to a frequency that is substantially equal to the carrier frequency and an offset frequency, the offset frequency being substantially equal to a difference between the carrier frequency and a null frequency that is centered at a notch of the sideband; and means for centering the notch at the zero frequency of the baseband signals.

20. The receiver of claim 19 further comprising:

means for filtering a portion of the in-phase signal that is greater than a set corner frequency; and means for filtering a portion of the quadrature signal that is greater than a set corner frequency.

21. The receiver of claim 19 further comprising:

means for producing a notch at the zero frequency of the in-phase signal; and means for producing a notch at the zero frequency of the quadrature signal.

* * * * *